United States Patent
Kellerman et al.

(10) Patent No.: US 9,267,219 B2
(45) Date of Patent: Feb. 23, 2016

(54) GAS-LIFT PUMPS FOR FLOWING AND PURIFYING MOLTEN SILICON

(75) Inventors: Peter L. Kellerman, Essex, MA (US); Frederick Carlson, Potsdam, NY (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 153 days.

(21) Appl. No.: 13/039,789

(22) Filed: Mar. 3, 2011

(65) Prior Publication Data

US 2011/0271897 A1    Nov. 10, 2011

Related U.S. Application Data

(60) Provisional application No. 61/332,068, filed on May 6, 2010.

(51) Int. Cl.
| | | |
|---|---|---|
| *C30B 15/06* | (2006.01) | |
| *C30B 11/00* | (2006.01) | |
| *C30B 29/06* | (2006.01) | |
| *C03B 29/08* | (2006.01) | |

(52) U.S. Cl.
CPC .............. *C30B 11/007* (2013.01); *C30B 29/06* (2013.01); *C03B 29/08* (2013.01); *C30B 15/06* (2013.01); *Y10T 117/1044* (2015.01); *Y10T 117/1048* (2015.01); *Y10T 117/1068* (2015.01)

(58) Field of Classification Search
CPC .............................. C30B 11/007; C30B 29/06
USPC ......................................................... 117/13
See application file for complete search history.

(56) References Cited

U.S. PATENT DOCUMENTS

| 2,008,114 | A | 7/1935 | Taggart |
| 2,142,484 | A | 1/1939 | Jennings |
| 4,148,622 | A | 4/1979 | Heitzer et al. |
| 4,264,407 | A | 4/1981 | Shudo et al. |
| 4,289,571 | A * | 9/1981 | Jewett ............................. 117/27 |
| 4,590,988 | A * | 5/1986 | Fukuoka et al. ............... 164/463 |
| 7,608,146 | B2 | 10/2009 | Clark |
| 7,816,153 | B2 | 10/2010 | Kellerman et al. |
| 7,855,087 | B2 | 12/2010 | Kellerman et al. |
| 2002/0040675 | A1 | 4/2002 | Pandelisev |
| 2009/0039478 | A1 * | 2/2009 | Bucher et al. .................. 257/655 |
| 2009/0233396 | A1 * | 9/2009 | Kellerman et al. ............. 438/57 |
| 2010/0025885 | A1 * | 2/2010 | Clark ............................. 264/212 |

FOREIGN PATENT DOCUMENTS

| EP | 0514175 A1 | 11/1992 | |
| EP | 514175 A1 * | 11/1992 | ................ C23C 2/36 |

(Continued)

OTHER PUBLICATIONS

S.Z. Kassab et al., Experimental and Analytical Investigations of Airlift Pumps Operating in Three-Phase Flow, Chemical Engineering J., 2007, vol. 131, pp. 273-281.

(Continued)

*Primary Examiner* — Michael Kornakov
*Assistant Examiner* — Hua Qi

(57) ABSTRACT

The embodiments herein relate to a sheet production apparatus. A vessel is configured to hold a melt of a material and a cooling plate is disposed proximate the melt. This cooling plate configured to form a sheet of the material on the melt. A pump is used. In one instance, this pump includes a gas source and a conduit in fluid communication with the gas source. In another instance, this pump injects a gas into a melt. The gas can raise the melt or provide momentum to the melt.

17 Claims, 9 Drawing Sheets

(56) References Cited

FOREIGN PATENT DOCUMENTS

| JP | 52105920 A | | 9/1977 | |
|----|------------|---|--------|---|
| JP | 6068142 A | | 4/1985 | |
| JP | 05295506 A | * | 11/1993 | ............... C23C 2/00 |
| TW | 200910620 | | 3/2009 | |
| WO | 2009114764 A2 | | 9/2009 | |
| WO | 2010104838 A1 | | 9/2010 | |

OTHER PUBLICATIONS

S.Z. Kassab et al., Air-lift Pumps Characteristics under Two-Phase Flow Conditions, Int'l J. of Heat and Fluid Flow, 2009, vol. 30, pp. 88-98.

William A. Wurts et al., Performance and Design Characteristics of Airlift Pumps for Filed Applications, World Aquaculture, Dec. 1994, 12(4), pp. 51-55.

P. Di Marco et al., Experimental Study on Rising Velocity of Nitrogen Bubbles in FC-72, Int'l J. of Thermal Sci., 2003, vol. 42, pp. 435-446.

A.H. Stenning & C.B. Martin, An Analytical and Experimental Study of Air-Lift Pump Performance, Transactions of ASME, Apr. 1968, pp. 106-110.

Office Action in Japan Issued Jun. 10, 2014 for Japan Patent Application No. 2013-509054.

* cited by examiner

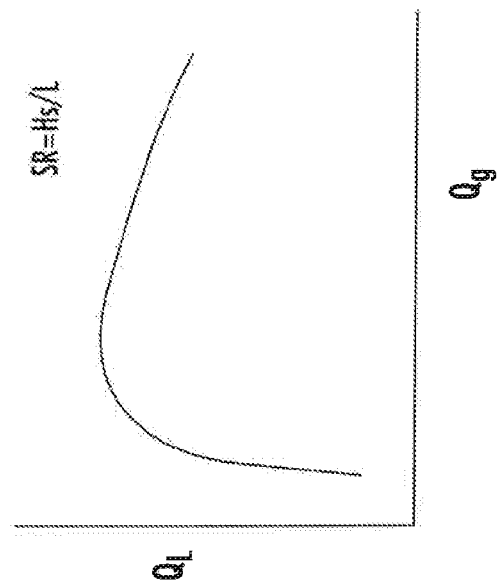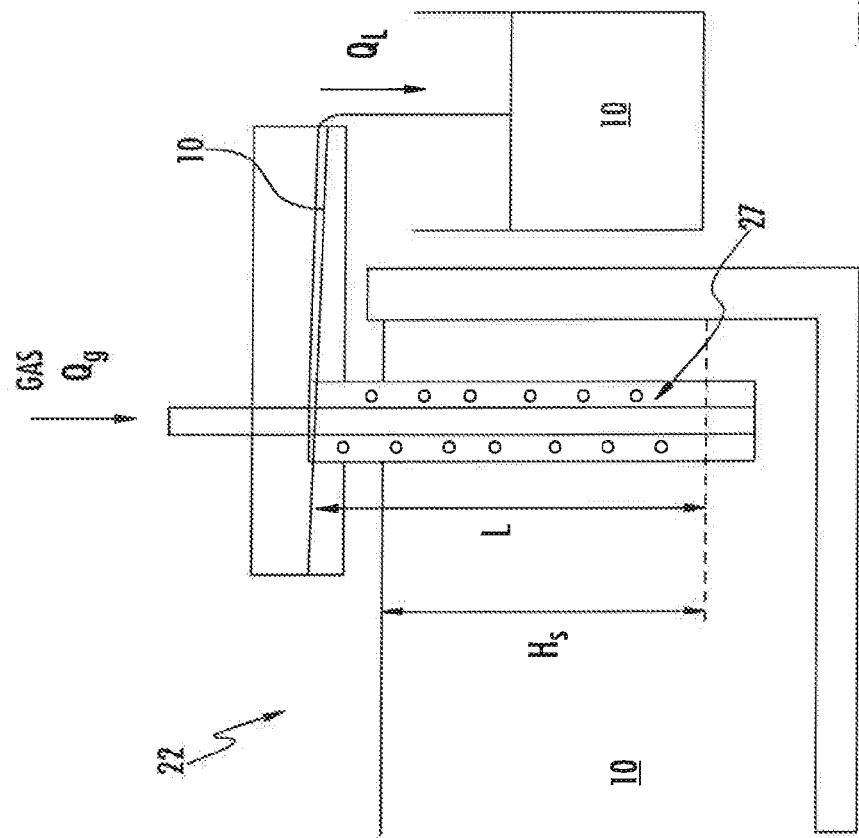
FIG. 3

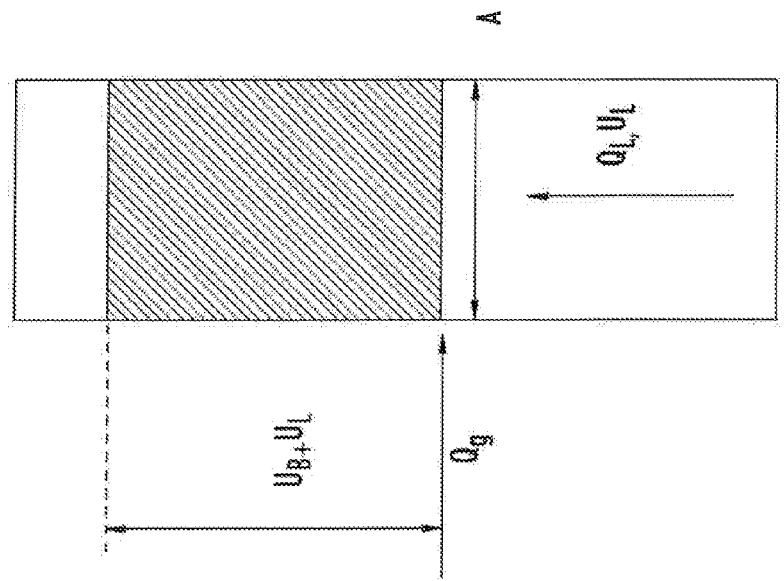
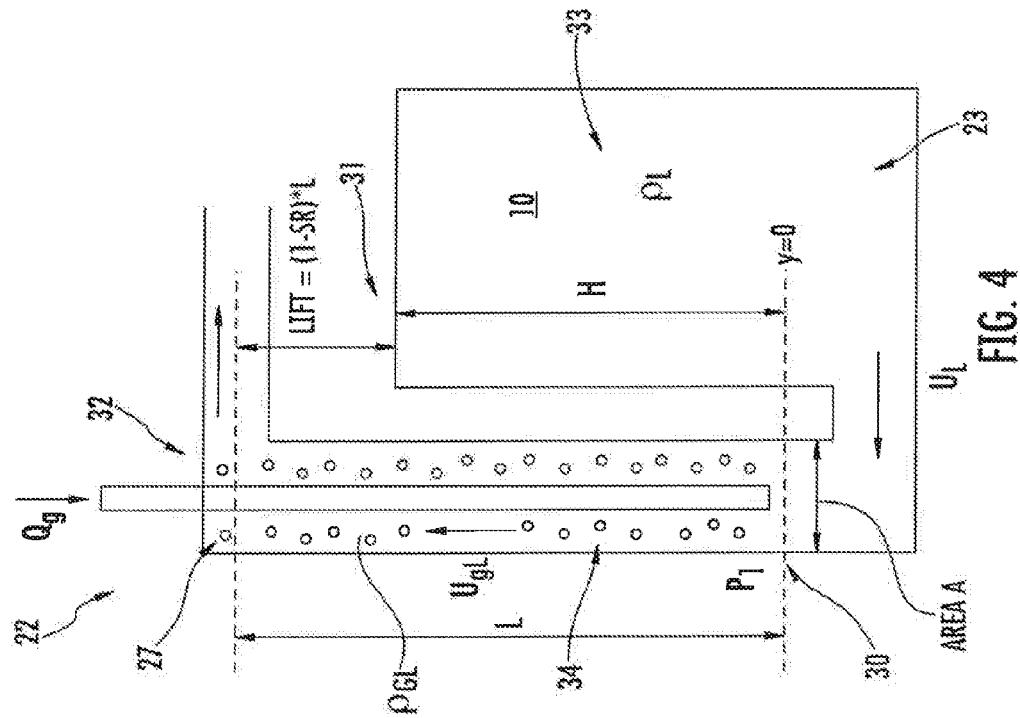

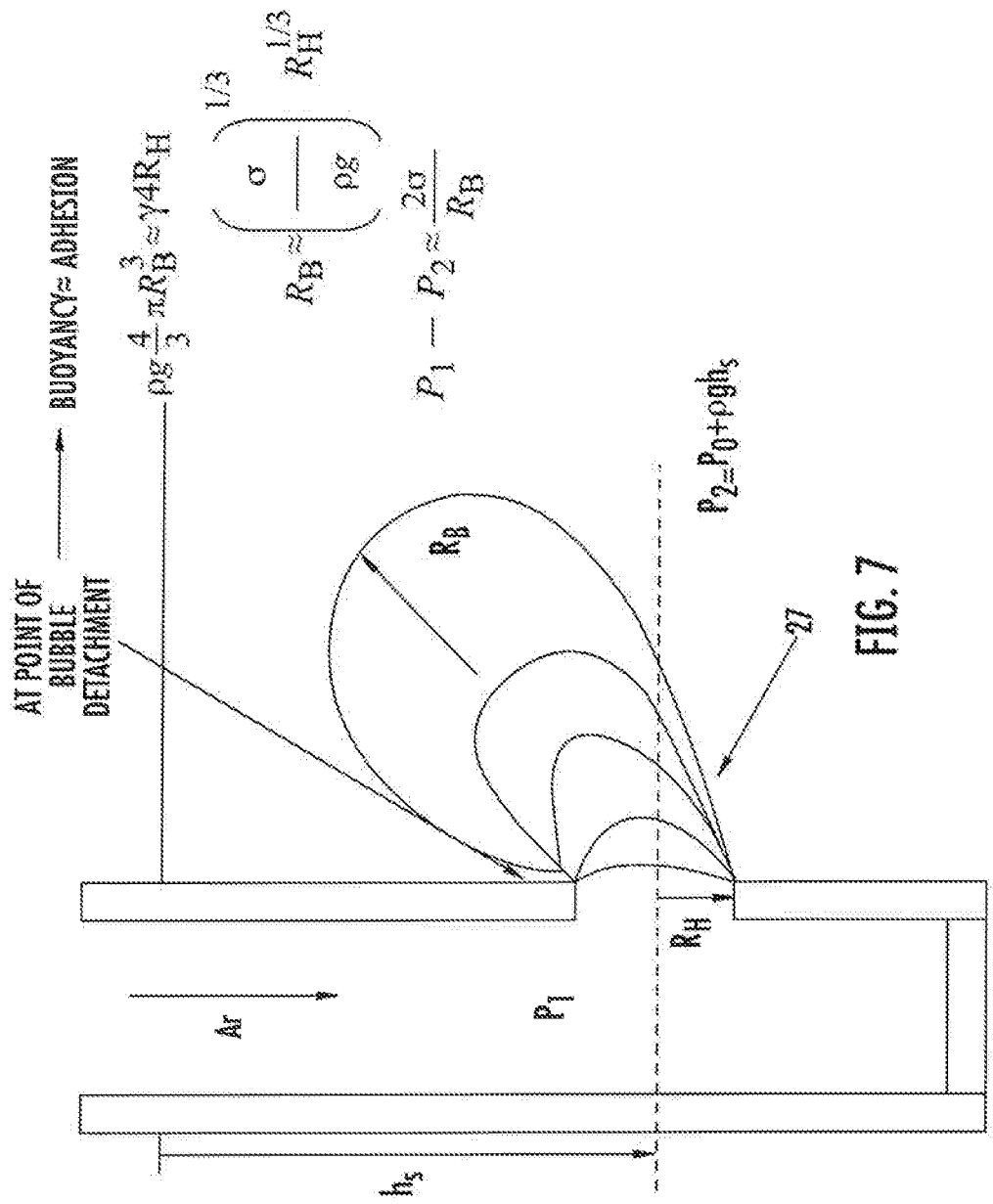

GAS-LIFT PUMPS FOR FLOWING AND PURIFYING MOLTEN SILICON

CROSS-REFERENCE TO RELATED APPLICATIONS

This application claims priority to the provisional patent application entitled "Gas-Lift Pumps for Flowing and Purifying Molten Silicon," filed May 6, 2010 and assigned U.S. App. No. 61/332,068, the disclosure of which is hereby incorporated by reference.

STATEMENT REGARDING FEDERALLY SPONSORED RESEARCH OR DEVELOPMENT

The U.S. Government has a paid-up license in this invention and the right in limited circumstances to require the patent owner to license others on reasonable terms as provided for by the terms of contract number DE-EE0000595 awarded by the U.S. Department of Energy.

FIELD

This invention relates to sheet formation from a melt and, more particularly, to methods of flowing or pumping a melt.

BACKGROUND

Silicon wafers or sheets may be used in, for example, the integrated circuit or solar cell industry. Demand for solar cells continues to increase as the demand for renewable energy sources increases. The majority of solar cells are made from silicon wafers, such as single crystal silicon wafers. Currently, a major cost of a crystalline silicon solar cell is the wafer on which the solar cell is made. The efficiency of the solar cell, or the amount of power produced under standard illumination, is limited, in part, by the quality of this wafer. As the demand for solar cells increases, one goal of the solar cell industry is to lower the cost/power ratio. Any reduction in the cost of manufacturing a wafer without decreasing quality will lower the cost/power ratio and enable the wider availability of this clean energy technology.

The highest efficiency silicon solar cells may have an efficiency of greater than 20%. These are made using electronics-grade monocrystalline silicon wafers. Such wafers may be made by sawing thin slices from a monocrystalline silicon cylindrical boule grown using the Czochralski method. These slices may be less than 200 µm thick. To maintain single crystal growth, the boule must be grown slowly, such as less than 10 µm/s, from a crucible containing a melt. The subsequent sawing process leads to approximately 200 µm of kerf loss, or loss due to the width of a saw blade, per wafer. The cylindrical boule or wafer also may need to be squared off to make a square solar cell. Both the squaring and kerf losses lead to material waste and increased material costs. As solar cells become thinner, the percent of silicon waste per cut increases. Limits to ingot slicing technology may hinder the ability to obtain thinner solar cells.

Other solar cells are made using wafers sawed from polycrystalline silicon ingots. Polycrystalline silicon ingots may be grown faster than monocrystalline silicon. However, the quality of the resulting wafers is lower because there are more defects and grain boundaries, which results in lower efficiency solar cells. The sawing process for a polycrystalline silicon ingot is as inefficient as a monocrystalline silicon ingot or boule.

Yet another solution is to pull a thin ribbon of silicon vertically from a melt and then allow the pulled silicon to cool and solidify into a sheet. The pull rate of this method may be limited to less than approximately 18 mm/minute. The removed latent heat during cooling and solidifying of the silicon must be removed along the vertical ribbon. This results in a large temperature gradient along the ribbon. This temperature gradient stresses the crystalline silicon ribbon and may result in poor quality multi-grain silicon. The width and thickness of the ribbon also may be limited due to this temperature gradient. For example, the width may be limited to less than 80 mm and the thickness may be limited to 180 µm.

Producing sheets horizontally from a melt may be less expensive than silicon sliced from an ingot and may eliminate kerf loss or loss due to squaring. Sheets produced horizontally from a melt also may be less expensive than a silicon ribbon pulled vertically from a melt. Furthermore, sheets produced horizontally from a melt may improve the crystal quality of the sheet compared to silicon ribbons pulled vertically or at an angle from a melt. A crystal growth method such as this that can reduce material costs would be a major enabling step to reduce the cost of silicon solar cells.

Horizontal ribbons of silicon that are physically pulled from a melt have been tested. In one method, a seed attached to a rod is inserted into the melt and the rod and resulting sheet are pulled at a low angle over the edge of the crucible. The angle, surface tension, and melt level are balanced to prevent the melt from spilling over the crucible. It is difficult, however, to initiate and control such a pulling process. First, the angle of inclination adjustment to balance gravity and surface tension of the meniscus formed at the crucible edge may be difficult. Second, a temperature gradient along the ribbon at the separation point between the sheet and the melt may cause dislocations in the crystal if the cooling plate is near this separation point. Third, inclining the sheet above the melt may result in stress at the freeze tip. This freeze tip may be where the sheet is thinnest and most fragile so dislocations or breaks in the sheet may occur. Fourth, a complex pulling apparatus may be needed to obtain the low angle.

Silicon used for electronics or solar cells may require high-quality silicon crystals. Solutes in the silicon feedstock, such as iron, have a negative effect on the solid state properties of the crystal. In one instance, minority carrier lifetime in devices made using such a sheet may be affected. Solutes also tend to segregate out of the crystal and can concentrate in the melt. This may lead to constitutional supercooling and dendritic growth. As the rate of solidification of the silicon increases, constitutional supercooling likewise may increase. Use of thermal gradients may create a convective flow in the melt and wash away any solutes from the freezing interface, but this also may cause thermal stress in the crystal. Thermal stress may lead to dislocations or defects.

Quartz may be used to surround the silicon melt in one embodiment. However, quartz may dissolve when in contact with this melt. Oxygen may be released into the melt and may form SiO, which results in oxygen in the silicon crystal that is formed. Oxygen may, for example, cause boron clustering in p-type solar cells and light-induced degradation (LID) of solar cell efficiency. Thus, there is a need in the art for an improved method of creating flows in the melt without thermal gradients and a method of creating flows in the melt while removing SiO.

SUMMARY

According to a first aspect of the invention, a sheet production apparatus is provided. The apparatus comprises a vessel configured to hold a melt of a material, the vessel having a freezing area. A cooling plate is disposed proximate the melt. The cooling plate is configured to form a sheet of the material on the melt in the freezing area. A return is configured to hold the melt. A pump includes a gas source and a conduit in fluid communication with the gas source. One end of the conduit is connected to the return and another end of the conduit is connected to the freezing area. The gas source is configured to raise the melt from the return to the freezing area.

According to a second aspect of the invention, a sheet production apparatus is provided. The apparatus comprises a vessel configured to hold a melt of a material. A cooling plate is disposed proximate the melt. This cooling plate is configured to form a sheet of the material on the melt. A pump includes a gas source configured to inject a gas horizontally into the melt whereby the gas causes horizontal motion of the melt.

According to a third aspect of the invention, a method of sheet production is provided. The method comprises injecting a gas into a melt of a material. The melt is motivated by the gas whereby bubbles of the gas provide momentum to the melt. A sheet of the material is frozen on the melt and the sheet is removed from the melt.

BRIEF DESCRIPTION OF THE DRAWINGS

For a better understanding of the present disclosure, reference is made to the accompanying drawings, which are incorporated herein by reference and in which:

FIG. 3 is a cross-sectional side view of a first embodiment of a pump;

FIG. 4 is a second cross-sectional side view of the first embodiment of a pump;

FIG. 5 illustrates how the density of the liquid and gas depends on the volume flow of the liquid;

FIG. 7 illustrates the dependence of bubble size on surface tension and density;

DETAILED DESCRIPTION

The embodiments of the apparatus and methods herein are described in connection with solar cells. However, these also may be used to produce, for example, integrated circuits, flat panels, LEDs, or other substrates known to those skilled in the art. Furthermore, while the melt is described herein as being silicon, the melt may contain germanium, silicon and germanium, gallium, gallium nitride, other semiconductor materials, or other materials known to those skilled in the art. Thus, the invention is not limited to the specific embodiments described below.

Figure 1:
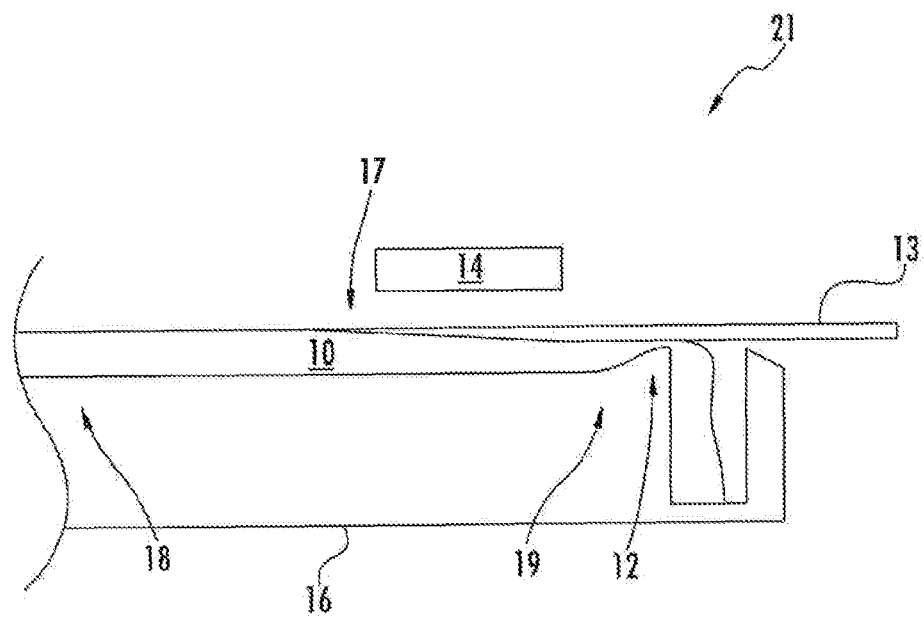
FIG. 1 is a cross-sectional side view of an embodiment of an apparatus that separates a sheet from a melt.

FIG. 1 is a cross-sectional side view of an embodiment of an apparatus that separates a sheet from a melt. The sheet-forming apparatus 21 has a vessel 16. The vessel 16 may be, for example, tungsten, boron nitride, aluminum nitride, molybdenum, graphite, silicon carbide, or quartz. The vessel 16 is configured to contain a melt 10. This melt 10 may be silicon. A sheet 13 will be formed on the melt 10. In one instance, the sheet 13 will at least partly float within the melt 10. While the sheet 13 is illustrated in FIG. 1 as floating in the melt 10, the sheet 13 may be at least partially submerged in the melt 10 or may float on top of the melt 10. The depth at which the sheet 13 is located is based partly on the relative densities of the sheet 13 and melt 10. In one instance, only 10% of the sheet 13 protrudes from above the top of the melt 10. The melt 10 may circulate within the sheet-forming apparatus 21.

This vessel 16 defines at least one channel 17. This channel 17 is configured to hold the melt 10 and the melt 10 flows from a first point 18 to a second point 19 of the channel 17. The melt 10 may flow due to, for example, a pressure difference, gravity, a pump, or other methods of transport. The melt 10 then flows over the spillway 12. This spillway 12 may be a ramp, a weir, a ledge, a small dam, or a corner and is not limited to the embodiment illustrated in FIG. 1. The spillway 12 may be any shape that allows a sheet 13 to be separated from the melt 10.

In one particular embodiment, the vessel 16 may be maintained at a temperature slightly above approximately 1685 K. For silicon, 1685 K represents the freezing temperature or interface temperature. By maintaining the temperature of the vessel 16 to slightly above the freezing temperature of the melt 10, the cooling plate 14 may function using radiation cooling to obtain the desired freezing rate of the sheet 13 on or in the melt 10. The cooling plate 14 in this particular embodiment is composed of a single segment or section but also may include multiple segments or sections. The bottom of the channel 17 may be heated above the melting temperature of the melt 10 to create a small vertical temperature gradient in the melt 10 at the interface to prevent constitutional supercooling or the formation of dendrites, or branching projections, on the sheet 13. However, the vessel 16 may be any temperature above the melting temperature of the melt 10. This prevents the melt 10 from solidifying on the vessel 16.

The sheet-forming apparatus 21 may be maintained at a temperature slightly above the freezing temperature of the melt 10 by at least partially or totally enclosing the sheet-forming apparatus 21 within an enclosure. If the enclosure maintains the sheet-forming apparatus 21 at a temperature above the freezing temperature of the melt 10, the need to heat the sheet-forming apparatus 21 may be avoided or reduced and heaters in or around the enclosure may compensate for any heat loss. This enclosure may be isothermal with anisotropic conductivity. In another particular embodiment, the heaters are not disposed on or in the enclosure and are rather in the sheet-forming apparatus 21. In one instance, different regions of the vessel 16 may be heated to different temperatures by embedding heaters within the vessel 16 and using multi-zone temperature control.

The enclosure may control the environment where the sheet-forming apparatus 21 is disposed. In a specific embodiment, the enclosure contains an inert gas. This inert gas may be maintained at above the freezing temperature of the melt 10. The inert gas may reduce the addition of solutes into the melt 10 that may cause constitutional instabilities during the formation of the sheet 13.

The cooling plate 14 allows heat extraction that enables the sheet 13 to form on the melt 10. The cooling plate 14 may cause the sheet 13 to freeze on or in the melt 10 when the temperature of the cooling plate 14 is lowered below the freezing temperature of the melt 10. This cooling plate 14 may use radiation cooling and may be fabricated of for example, graphite, quartz, or silicon carbide. Disturbances to the melt 10 may be reduced while the sheet 13 forms to prevent imperfections in the sheet 13. Cooling a sheet 13 on the surface of the melt 10 or a sheet 13 that floats on the melt 10 allows the latent heat of fusion to be removed slowly and over a large area while having a relatively large sheet 13 extraction rate.

After the sheet 13 is formed on the melt 10, the sheet 13 is separated from the melt 10 using the spillway 12. The melt 10 flows from the first point 18 to the second point 19 of the channel 17. The sheet 13 will flow with the melt 10. This transport of the sheet 13 may be a continuous motion. In one instance, the sheet 13 may flow at approximately the same speed that the melt 10 flows. Thus, the sheet 13 may form and be transported while at rest with respect to the melt 10. The shape of the spillway 12 or orientation of the spillway 12 may be altered to change the velocity profile of the melt 10 or sheet 13.

The melt 10 is separated from the sheet 13 at the spillway 12. In one embodiment, the flow of the melt 10 transports the melt 10 over the spillway 12 and may, at least in part, transport the sheet 13 over the spillway 12. This may minimize or prevent breaking a sheet 13 because no external stress is applied to the sheet 13. Of course, the sheet 13 also may be pulled or have some external force applied. The melt 10 will flow over the spillway 12 away from the sheet 13 in this particular embodiment. Cooling may not be applied at the spillway 12 to prevent thermal shock to the sheet 13. In one embodiment, the separation at the spillway 12 occurs in near-isothermal conditions. The sheet 13 may tend to go straight beyond the spillway 12 in one embodiment. This sheet 13 may be supported after going over the spillway 12 in some instances to prevent breakage.

Figure 2:
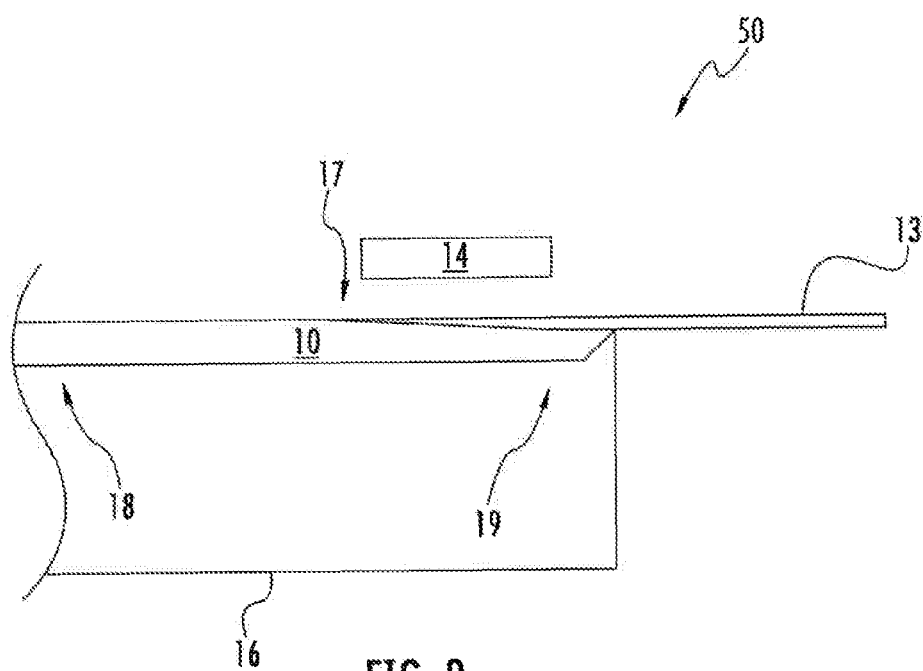
FIG. 2 is a cross-sectional side view of a second embodiment of apparatus that separates a sheet from a melt.

Of course, different cooling temperatures across the length of the cooling plate 14, different flow rates of the melt 10 or pull speeds of the is sheet 13, the length of the various sections of the sheet-forming apparatus 21, or the timing within the sheet-forming apparatus 21 may be used for process control. If the melt 10 is silicon, the sheet 13 may be polycrystalline or single crystal sheet using the sheet-forming apparatus 21. FIG. 1 is only one examples of a sheet-forming apparatus that can form a sheet 13 from a melt 10. Other apparatuses or methods of horizontal sheet 13 growth are possible. The embodiments described herein may be applied to any horizontal or vertical sheet 13 growth method or apparatus. Thus, the embodiments described herein are not limited solely to the specific embodiment of FIG. 1. For example, FIG. 2 is a cross-sectional side view of a second embodiment of an apparatus that separates a sheet from a melt. In the sheet-forming apparatus 50, the melt 10 is contained in the vessel 16. A sheet 13 is pulled from the melt 10 after formation by the cooling plate 14. While horizontal in FIG. 2, the sheet 13 also may be at an angle with respect to the melt 10. In the embodiments of FIGS. 1-2, the melt 10 may circulate around the sheet-forming apparatus 21 or sheet-forming apparatus 50, such as around the sides of the sheet-forming apparatus 21 or sheet-forming apparatus 50. Of course, the melt 10 also may be stationary during part or all of the sheet 13 formation process.

Embodiments of the apparatus and methods disclosed herein pump the melt 10 without introducing large thermal gradients or additional contaminants and instead may remove SiO from the melt 10. FIG. 3 is a cross-sectional side view of a first embodiment of a pump. The gas enters and the liquid is raised with the gas. Thus, the bubbles 27 assist in raising the melt 10, which is liquid. These bubbles 27 may be, for example, a noble gas, nitrogen, hydrogen, or other species known to those skilled in the art. This pump 22 may be described with a "performance curve," which relates the liquid flow rate $Q_L$ to the gas flow rate $Q_g$ for different submergence ratios $SR=H_s/L$. Such a performance curve is illustrated on the right of FIG. 3.

FIG. 4 is a second cross-sectional side view of the first embodiment of a pump. An approximation is made herein that the melt 10 in the liquid region 33 and bubbles region 34 in the pump 22 is described as a continuous fluid. Neglecting frictional effects, Bernoulli's equation can be applied at the three points 30, 31, and 32 illustrated in FIG. 3.

$$u_{gL} = \left(\frac{2\rho_L gH}{\rho_{gL}} - 2gL\right)^{1/2}$$

$$P_1 + \frac{1}{2}\rho_L u_L^2 = P_a + \rho_L gH = P_a + \frac{1}{2}\rho_{gL} u_{gL}^2 + \rho_{gL} gL$$

From an energy standpoint, the gravitational potential energy in the reservoir 23 goes into kinetic energy of flow of the melt 10 with lower density liquid and gas. The density of the liquid and gas depends on the gas flow and the velocity of the bubbles 27. The bubble 27 terminal velocity is the result of the balance between buoyancy and drag. There are several regimes of behavior depending on bubble size. For this particular embodiment, the size of the bubbles 27 may be between approximately 1-5 mm and the bubbles 27 may be spherical or may flatten out. This results in the bubble 27 terminal velocity being relatively independent of the diameter of the bubble 27. The following equation gives a semi-empirical relation for this bubble 27 terminal velocity relative to the liquid of the melt 10:

$$u_B = \left(\frac{4gd}{3C_D}\right)^{1/2}, C_D = \sqrt{Eo}, Eo = \frac{\rho_L g d^2}{\sigma}$$

$$u_B = \left(\frac{16g\sigma}{9\rho_L}\right)^{1/4} = 23 \frac{cm}{s}(H_2O) = 33 \frac{cm}{s}(Si)$$

FIG. 5 illustrates how the density of the liquid and gas depends on the volume flow of the liquid. In FIG. 5, the slash marks represents the area with both bubbles and melt. The flow of the liquid may be represented by $Q_L=u_L A$ where $u_L$ is the liquid velocity and A is the cross-sectional area. Over a time interval dt, bubbles and liquid rise the distance $(u_L+u_B)$ dt, filling the volume $V_g L=A(u_B+u_L)dt$. $V_g=Q_g dt$ is gas and $V_L=A(u_B+u_L)dt-Q_g dt$ is liquid. Thus, the average density of gas and liquid ($\rho_{gL}$) is:

$$\rho_{gL} = \frac{\rho_L V_L + \rho_g V_g}{V_{gL}} = \frac{\rho_L A u_B - (\rho_L - \rho_g) Q_g + \rho_L Q_L}{u_B A + Q_L}$$

where $\rho_L$ is the density of the liquid, $\rho_g$ is the density of the gas, $V_L$ is the volume of the liquid, and $V_g$ is the volume of the gas. The continuity equation is represented by:

$$\rho_L u_L A = \rho_{gL} u_{gL} A$$

$$u_L = u_{gL} \frac{\rho_{gL}}{\rho_L}$$

This states from a conservation of mass basis that if the density of the liquid decreases, such as by the introduction of the bubbles, velocity of the liquid must increase. This assumes that the liquid does not slip back between the bubbles as the bubbles rise. This, in fact, may not be true, so a "slip factor" s is introduced to make an empirical correction.

$$\frac{u_L}{u_{gL}} < \frac{\rho_{gL}}{\rho_L}$$

$$\frac{u_L}{u_{gL}} = s \frac{\rho_{gL}}{\rho_L}$$

Putting these equations together:

$$\frac{Q_L}{A} = \frac{s(A u_B - Q_g + Q_L)}{u_B A + Q_L} \left( \frac{2 \rho_L g H}{\rho_{gL}} - 2gL \right)^{1/2}$$

This equation may be solved iteratively for a given geometry and bubble velocity to get $Q_L$ as a function of $Q_g$ (i.e., the gas performance curve). This equation was applied to a small scale gas-lift pump test stand using water. Water was used for initial testing due to the difficulty in working with molten silicon. The bubble slip factor may depend on how high the liquid needs to be raised above the input or reservoir (submergence ratio) and the degree to which the bubbles fill the tube. Slip factor may be approximated as a power function of the submergence ration (SR) and "bubble fill ratio" bf=$(\rho_L - \rho_{gL})/\rho_L$. Thus, s=$SR^\alpha(bf^\beta)$, where $\alpha$ and $\beta$ may be determined by fitting data.

Figure 6B:
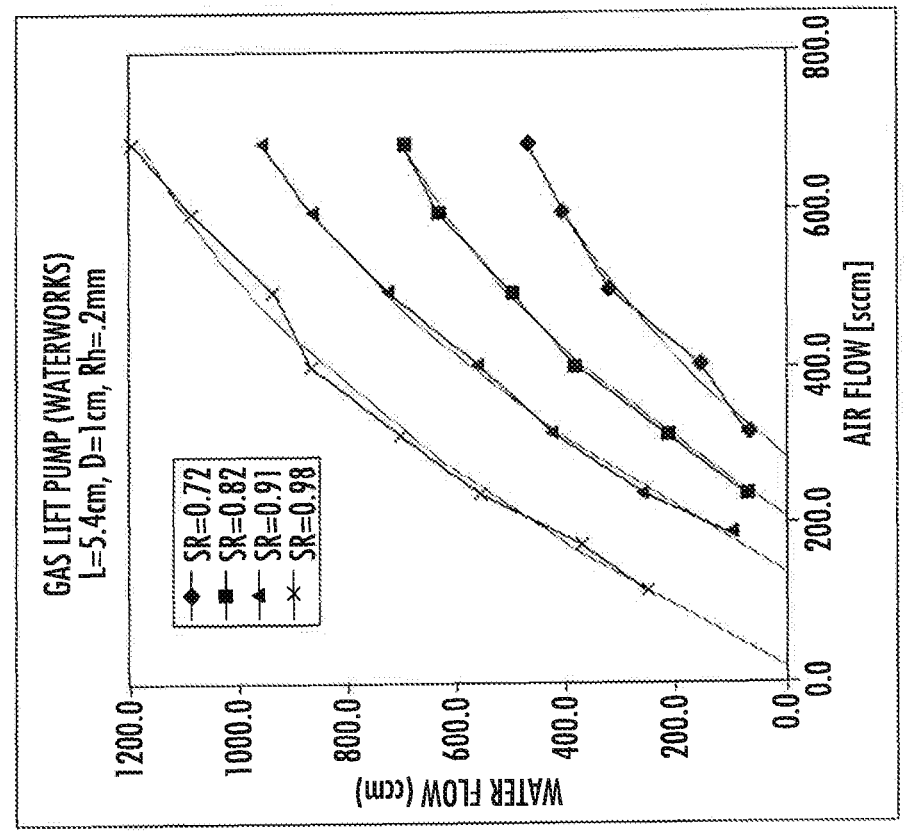
FIGS. 6A-B are a comparison of calculations and actual data for pump performance curves and $\alpha$ and $\beta$.
Figure 6A:
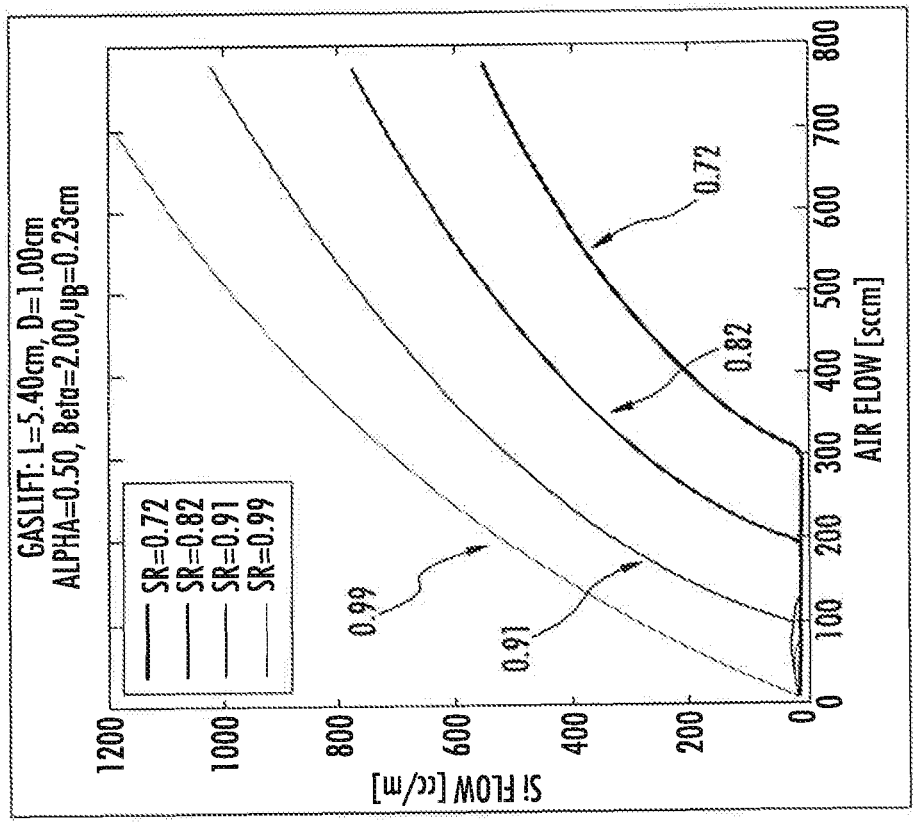

FIGS. 6A-B are a comparison of calculations and actual data for pump performance curves and $\alpha$ and $\beta$. The Gas Lift Pump (Waterworks) graph of FIG. 6B illustrates actual data using water while the Gas Lift of FIG. 6A represents predicted results. Experiments were performed using tubes with L=5.4 cm with air injected near the bottom via a concentric air pipe with an outer diameter of 3 mm and 0.2 mm holes drilled on the sides near the end which was blocked off (similar to FIG. 3). The depth of the reservoir $H_s$ was varied to change the submergence ratio. The bubble velocity was taken at 0.23 m/s in accordance with the equations above. Using $\alpha$ of 0.5 and $\beta$ of 2 yielded the best fit for experimental data as illustrated in FIG. 6.

A gas-lift pump may be used with molten silicon or other liquid melts that may be at high temperatures. The density ($\rho$) of water is 1 g/cm$^3$, while the density of silicon is 2.53 g/cm$^3$. The surface tension ($\sigma$) of water is 72 dynes/cm, while the surface tension of silicon is 720 dynes/cm. The dynamic viscosity ($\mu$) of water is 0.89E-3 Ns/m$^2$, while the dynamic viscosity of silicon is 0.78E-3 Ns/m$^2$. In reference to the equations above, density of the liquid may not affect the calculations because of the balance between buoyancy and inertia. So while silicon has a density 2.5 times greater than water, a bubble in silicon will be 2.5 times more buoyant than the same bubble in water. The viscosity of silicon and water is similar, but viscosity may not affect the calculations. Pumping performance depends on surface tension through the bubble velocity $u_B$, as well as indirectly through the slip factor s. But the bubble velocity only depends on $(\sigma/\rho)^{0.25}$, which is approximately 1.4 times higher in silicon than water.

The size of the bubble emerging from a submerged hole in a pipe can be estimated by considering the surface tension adherence of the bubble to the hole, balanced by the buoyancy force lifting the bubble upward. FIG. 7 illustrates the dependence of bubble size on surface tension and density. Based on FIG. 7, size of the bubble 27 depends on $(\sigma/\rho)^{0.33}$, so that the bubble size for argon in silicon is approximately 1.6 times greater for silicon than water. So although the surface tension of silicon is an order of magnitude greater in silicon than water, the effects on bubble velocity and size are not nearly as large.

Figure 8:
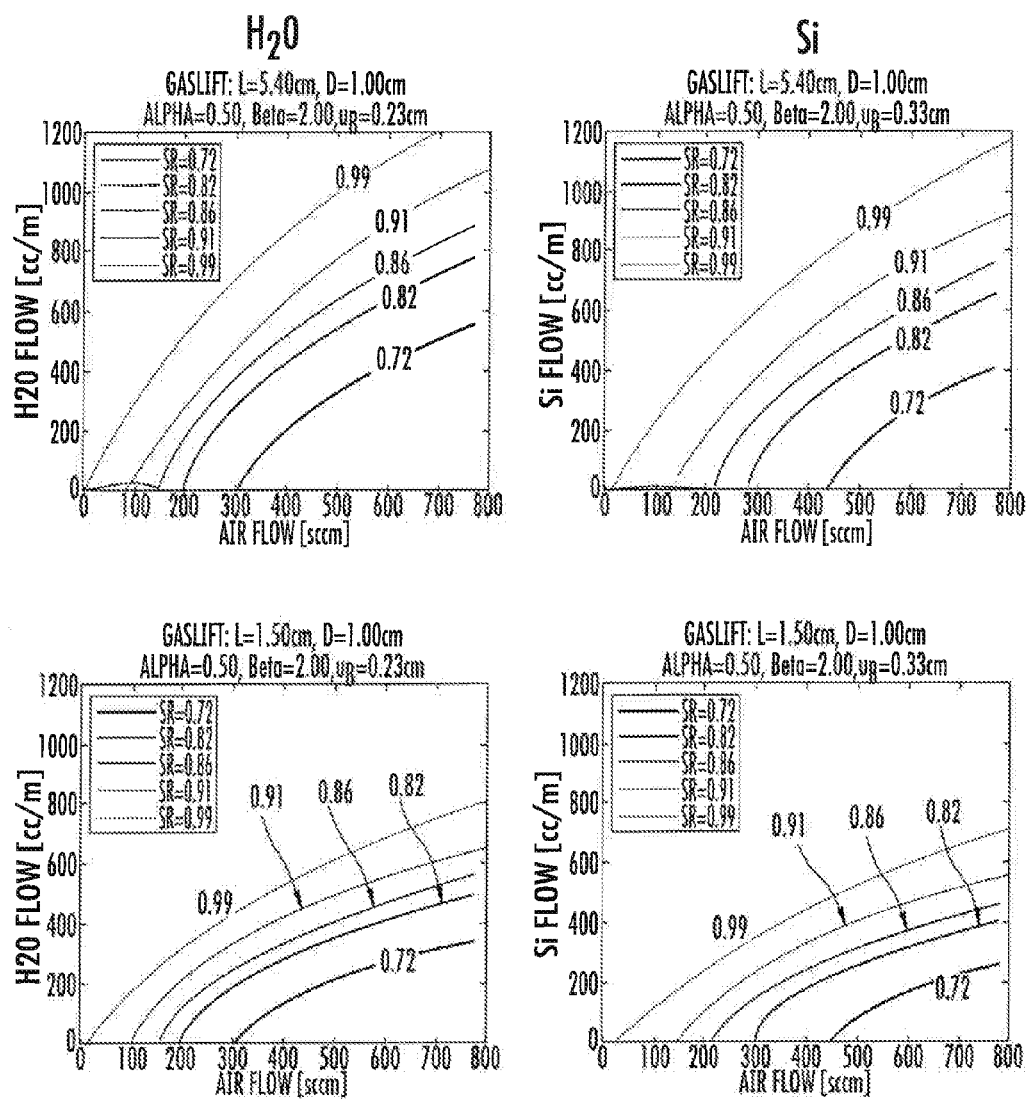
FIG. 8 compares predicted pump performance for silicon and water for two different gas-lift pump sizes.

FIG. 8 compares predicted pump performance for silicon and water for two different gas-lift pump sizes. The gas-lift pumps were two lengths: 1.4 cm and 5.4 cm. These results using water models demonstrate that pumping silicon with a gas-lift pump is feasible with similar performance compared to water.

Figure 9:
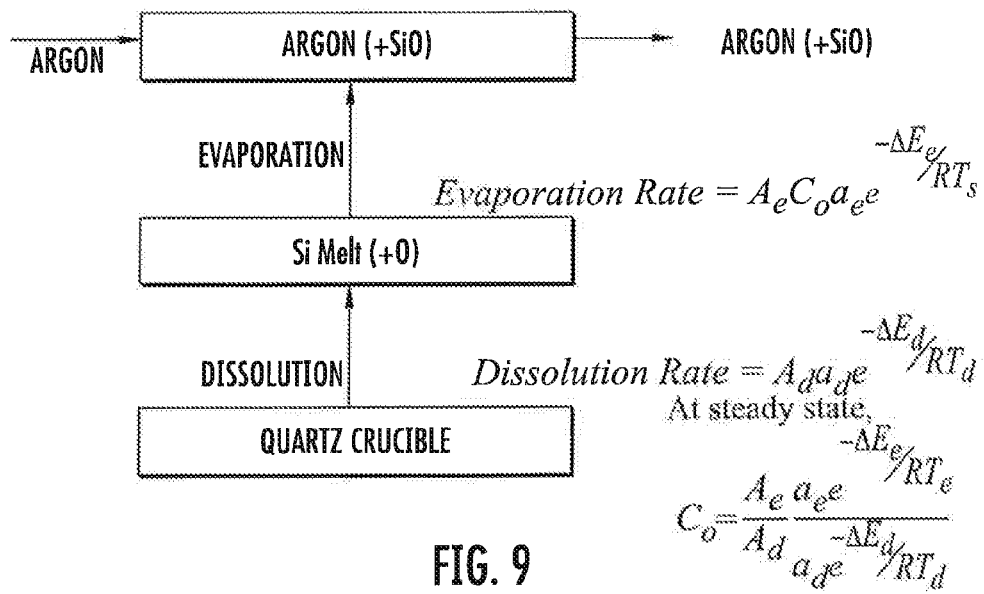
FIG. 9 is a flow diagram depicting the source and pumping of SiO in a silicon melt.

Pumps, such as gas-lift pumps, using argon or other noble gases with a silicon melt may purge SiO from the melt. FIG. 9 is a flow diagram depicting the source and pumping of SiO in a silicon melt. The SiO in one embodiment is a result of the quartz crucible or vessel that contains the silicon melt. Since the presence of oxygen in a solar cell, for example, leads to LID, removal of oxygen is an added benefit. As seen in FIG. 9, the SiO enters the melt due to dissolution of the quartz crucible or vessel. The steady state concentration of SiO in the melt is balanced between the dissolution of the quartz crucible or vessel (which is proportional to the wetted area of the crucible or vessel $A_d$) and the evaporation rate (which is proportional to the surface area exposed to argon $A_e$). The SiO concentration is proportional to the ratio of the areas $A_d/A_e$. Passing argon bubbles through the melt decreases this ratio, thus reducing the concentration of SiO in the melt.

Figure 10:
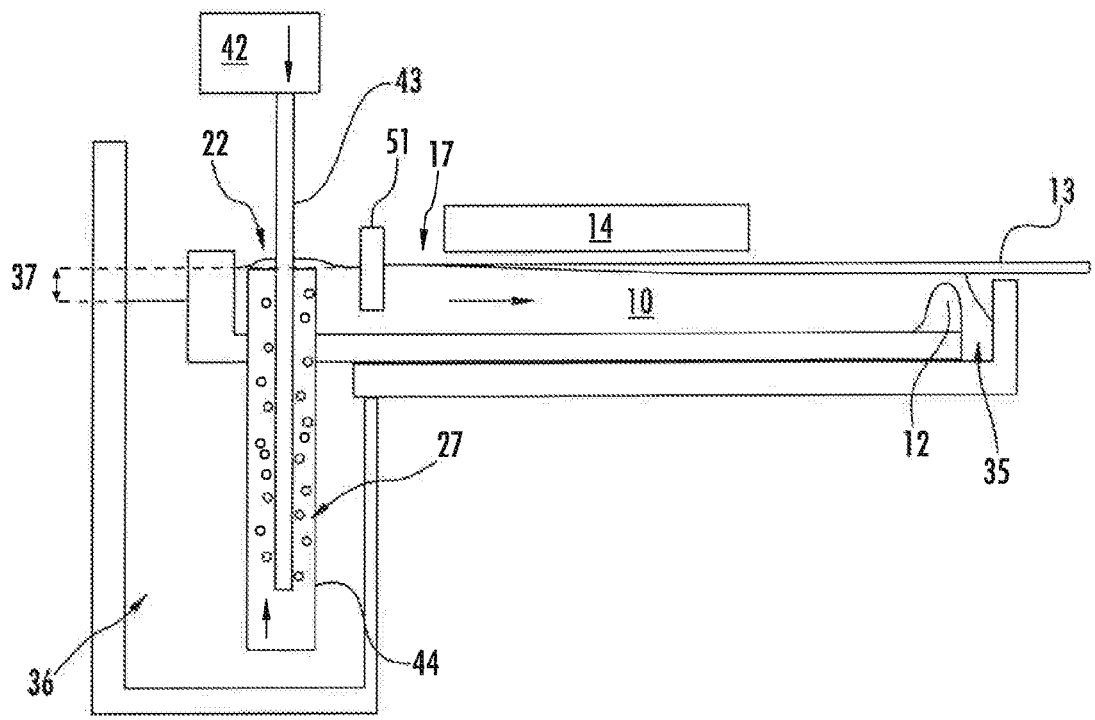
FIG. 10 is a cross-sectional side view of a first embodiment of a pump with an apparatus that separates a sheet from a melt.

FIG. 10 is a cross-sectional side view of a first embodiment of a pump with an apparatus that separates a sheet from a melt. Here, the sheet 13 is pulled or removed horizontally from the melt 10 after it passes over the spillway 12. The meniscus formed between the sheet 13 and the melt 10 is stabilized by flowing the melt 10 over the spillway 12 at the point of separation from the sheet 13. It is the drop in melt 10 over the spillway 12 that provides the lowered pressure in the melt 10 to stabilize this meniscus. The melt 10 may flow from point 35 back to point 36 using a return either going under the channel 17 and cooling plate 14 or around the sides of the channel 17. Part of the return may be lower than the area under the cooling plate 14. A baffle 51 is disposed in the melt 10.

A certain lift or head may be required to return the melt 10 from the point 35 after it passes over the spillway 12 to the level upstream of the spillway 12 and cold plate 14, such as point 36 or near the baffle 51. The pump 22, which may be a gas-lift pump, is configured to produce a head of greater than approximately 1 cm in one instance using a first conduit 43 length of greater than approximately 5 cm. As illustrated in FIG. 10, the pump 22 causes a lift of a height 37 from a first height to a second height.

The pump 22 may have parts fabricated of quartz. In this particular embodiment, the pump 22 has a gas source 42 is connected to and in fluid communication with a first conduit 43. The first conduit 43 is configured to allow for the flow of the gas from the gas source 42. The first conduit 43 is in fluid communication with a second conduit 44. The second conduit 44 is configured to contain the melt 10 and bubbles 27. Thus, one end of the second conduit 44 is connected to the return for the melt 10 and the other end of the second conduit 44 is connected to the channel 17 and the area where the sheet 13 is frozen or formed (i.e., a freezing area) or the point 35. The gas source 42 is configured to raise the melt 10 from the point 36.

Figure 11:
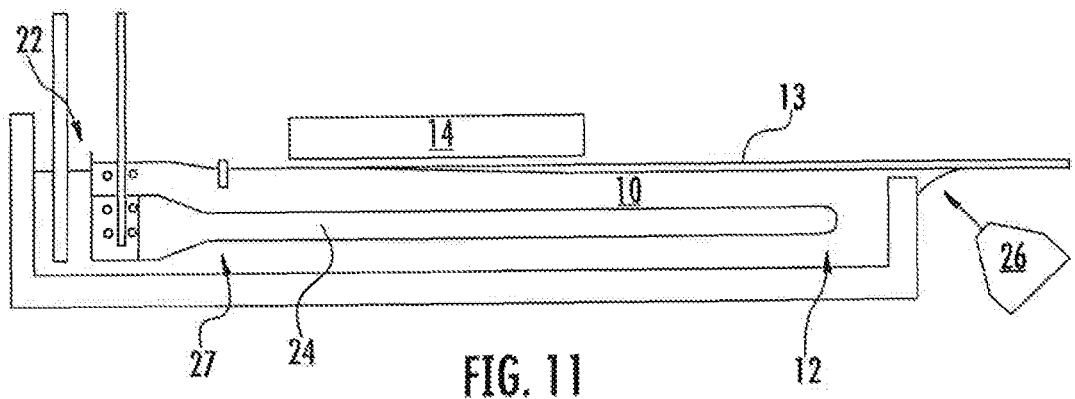
FIG. 11 is a cross-sectional side view of a second embodiment of a pump with an apparatus that separates a sheet from a melt.

FIG. 11 is a cross-sectional side view of a second embodiment of a pump with an apparatus that separates a sheet from a melt. In this embodiment, gas impingement, such as the gas jet 26, is used to pin the meniscus to the wall of the crucible and provide a pressure differential to stabilize this meniscus. The pump 22 operates with a submergence ration. SR=1 and the melt 10 flows with no head required. Thus, the pump 22 may be short, such as approximately 1 cm. The pump 22 may be incorporated into the flow divider 24 that includes the spillway 12. This embodiment includes a return 27 for the melt 10. Other embodiments disclosed herein also may include such a return 27. This return 27 is illustrated below the flow divider 24, but also may be to the side of the apparatus.

Figure 12:
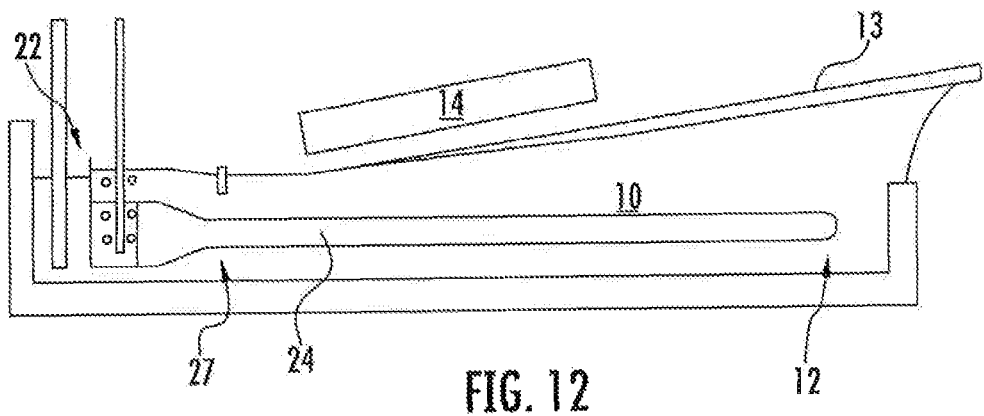
FIG. 12 is a cross-sectional side view of a third embodiment of a pump with an apparatus that separates a sheet from a melt.

FIG. 12 is a cross-sectional side view of a third embodiment of a pump with an apparatus that separates a sheet from a melt. This embodiment uses low angle silicon sheet method (LASS). The stabilization of the meniscus is provided by pulling upward on the sheet 13 at a small angle, thus providing a negative hydrostatic pressure at the point of separation between the sheet 13 and the meniscus or melt 10. Solutes rejected by the solid sheet 13 may be flushed away and constitutional supercooling may be avoided. Helium gas cooling may be required because large thermal gradients are needed to create thermal convection. Large heat extraction and thermal gradients within the sheet 13 may cause dislocations in the sheet. These gradients may be avoided or reduced through use of the pump 22. The pump 22 provides melt 10 convection without thermal gradients. The return 27 allows the melt 10 to return to the pump 22.

In another instance, the elasticity and buoyancy of the sheet 13 enables it to be removed from the melt 10 in a horizontal manner. The sheet 13 may then be angled or bent upward to a support structure. The pump 22 may be used to flow the melt 10 in such an instance.

Figure 13:
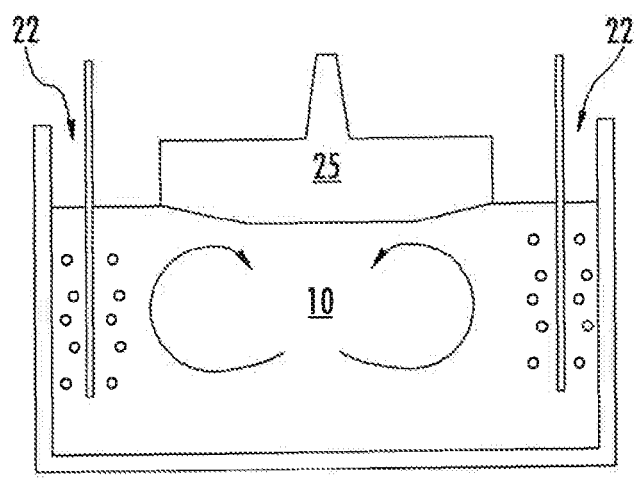
FIG. 13 is a cross-sectional side view of an embodiment of a pump for Czochralski processing.

Pumps also may be applied to Czochralski (Cz) processing. The oxygen pumping or removal feature may remove SiO created from the quartz crucibles that are used to produce Cz boules. The pump 22 may be fully submerged (i.e., SR=1) because only a small amount of flow is needed to create enough circulation to prevent the build-up of solutes. In one embodiment, an array of gas pipes surrounding the boule within the melt may be sufficient. No outer tubes may be needed on the gas-lift pump in this instance. The level in the crucible lowers as the boule is crystallized. FIG. 13 is a cross-sectional side view of an embodiment of a pump for Czochralski processing. The boule 25 is removed from the melt 10 and the melt 10 is circulated using the pumps 22. If a melt replenishment system is used and the melt level remains constant, tubes may be used with the pumps 22, which may increase pumping rates.

Figure 14:
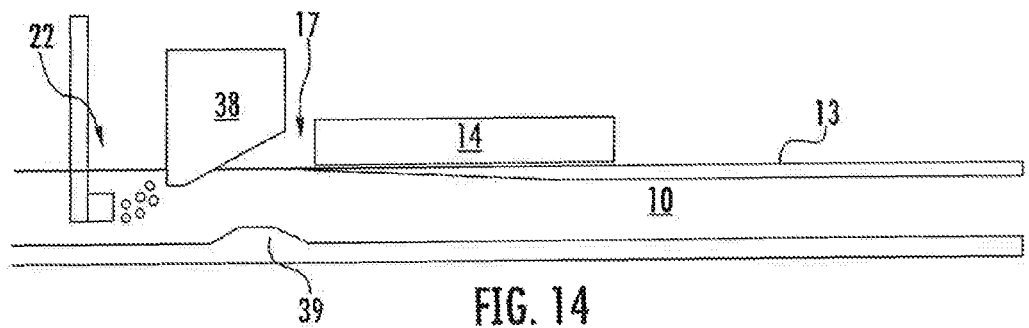
FIG. 14 is a cross-sectional side view of a fourth embodiment of a pump with an apparatus that separates a sheet from a melt.

FIG. 14 is a cross-sectional side view of a fourth embodiment of a pump with an apparatus that separates a sheet from a melt. The pump 22 motivates the melt 10 in this instance. Rather than lift the melt 10 from a first height to a second height, as seen in, for example, FIG. 10, the pump 22 merely induces flow of the melt 10 through injection of a gas. The bubbles can be injected horizontally into the melt 10. This may be performed at high pressure in one instance. The bubbles will entrap and motivate the melt 10 horizontally without providing a vertical rise or lifting the melt 10. Thus, the melt 10 remains approximately level. The pump 22 may include or be connected to a gas source. This system includes a first baffle 38 and second baffle 39 to affect the flow of the melt 10. The melt 10 may either return to the pump 22 below the channel 17 or to the sides of the channel 17.

Figure 15:
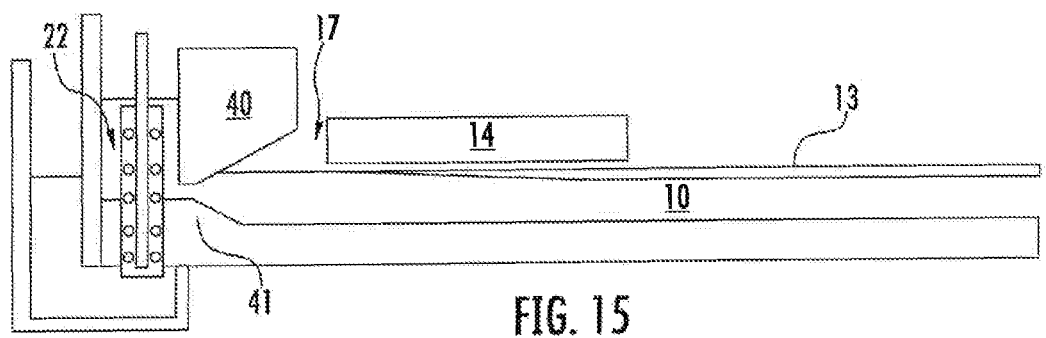
FIG. 15 is a cross-sectional side view of a fifth embodiment of a pump with an apparatus that separates a sheet from a melt.

FIG. 15 is a cross-sectional side view of a fifth embodiment of a pump with an apparatus that separates a sheet from a melt. The pump 22 in this embodiment may lift the melt 10 from a first height to a second height. The baffles 40, 41 may provide constriction and expansion of the melt 10 to potentially ensure uniform laminar flow. The melt 10 may either return to the pump 22 below the channel 17 or to the sides of the channel 17.

The embodiments disclosed herein have multiple advantages. Bubbles from a pump, such as a gas-lift pump, can raise a melt or provide momentum to a melt. Use of pumps 22 may not require moving parts in the melt 10. This increases reliability and decreases potential contamination. Furthermore, the removal of oxygen offers advantages for the fabrication of sheets 13 used to make solar cells. Solutes may be swept away from the crystallization front and constitutional supercooling may be prevented without introducing high temperature gradients needed for thermal convection. Thus, stress on the crystal of the sheet 13 is reduced and fewer dislocations may be formed. The pumping embodiments disclosed herein may be used in high-temperature systems and may provide a more uniform flow.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fail within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A sheet production apparatus comprising:
   a vessel configured to hold a melt of a material, said vessel having a channel corresponding to a freezing area;
   a cooling plate disposed proximate said melt, said cooling plate configured to form a sheet of said material on said melt in said freezing area;
   a return of said vessel configured to further hold said melt;
   a pump comprising a gas source and a first conduit and a second conduit in fluid communication with said gas source, one end of said first conduit being connected to said gas source and another end of said first conduit being disposed inside said second conduit, one end of said second conduit being connected to said return and another end of said second conduit being connected to said freezing area, wherein at least part of said first conduit is disposed above a surface of said melt and wherein said gas source is configured to raise said melt from said return to said freezing area;

a first baffle disposed partially in said melt and partially out of said melt, said first baffle disposed between said pump and said cooling plate along a melt flow direction; and a second baffle disposed in said melt on a surface of said channel, said second baffle comprising a protrusion extending upwardly from said surface of said channel into said melt towards said first baffle, said protrusion disposed proximate said first baffle such that an uppermost extending point of said protrusion is substantially vertically aligned beneath said first baffle, and said protrusion is positioned between said pump and said cooling plate along said melt flow direction, wherein the first baffle and the second baffle are configured to constrict and expand the melt when flowing from said pump to said freezing area.

2. The apparatus of claim 1, wherein said material is silicon or silicon and germanium.

3. The apparatus of claim 1, wherein said gas source forms bubbles in said first conduit, said bubbles configured to rise within said second conduit.

4. The apparatus of claim 1, wherein said pump is configured to cause horizontal motion of said melt in said freezing area.

5. The apparatus of claim 1, wherein said first conduit and said second conduit are fabricated of quartz.

6. The apparatus of claim 1, further comprising a gas jet disposed adjacent to said freezing area, said gas jet configured to stabilize a meniscus between said sheet and said melt.

7. A sheet production apparatus comprising:

a vessel configured to hold a melt of a material;

a cooling plate disposed proximate said melt, said cooling plate configured to form a sheet of said material on said melt in a channel; and a pump comprising a gas source, said gas source having an outlet positioned within the vessel such that gas is injected into said melt in a direction parallel to a surface of said melt whereby said gas causes motion of said melt in said direction;

a first baffle disposed partially in said melt and partially out of said melt, said first baffle disposed between said pump and said cooling plate along said direction; and a second baffle disposed in said melt on a bottom surface of said channel between said pump and said cooling plate along said direction, said second baffle having a protrusion extending upwardly from said bottom surface of said channel into said melt towards said first baffle and being disposed proximate said first baffle such that an uppermost extending point of said protrusion is substantially vertically aligned beneath said first baffle, and said protrusion is positioned between said pump and said cooling plate along said direction, wherein the first baffle and the second baffle are configured to constrict and expand the melt when flowing from said pump to said cooling plate.

8. The apparatus of claim 7, wherein said material is silicon or silicon and germanium.

9. The apparatus of claim 7, wherein a level of said melt is approximately the same proximate said pump as proximate said cooling plate.

10. The apparatus of claim 7, further comprising a return configured to hold said melt, said return connected downstream of said cooling plate and upstream of said pump.

11. The apparatus of claim 10, wherein a level of said melt is approximately the same proximate said pump, proximate said cooling plate, and in said return.

12. The apparatus of claim 7, wherein said direction is horizontal.

13. A sheet production apparatus comprising:

a vessel configured to hold a melt of a material, the vessel having a channel corresponding to a freezing area, and a return;

a cooling plate disposed above said melt, said cooling plate configured to cool a surface of said melt to form a sheet of said material on said melt as said melt traverses in a direction parallel to a top surface of said sheet; and a pump comprising a gas source configured to raise said melt from said return to said freezing area;

a first baffle disposed partially in said melt and partially out of said melt, said first baffle disposed between said pump and said cooling plate along said direction; and a second baffle disposed in said melt on a bottom surface of said channel between said pump and said cooling plate along said direction, said second baffle having a protrusion extending upwardly from said bottom surface of said channel into said melt towards said first baffle and being disposed proximate said first baffle such that an uppermost extending point of said protrusion is substantially vertically aligned beneath said first baffle, and said protrusion is positioned between said pump and said cooling plate along said direction, wherein the first baffle and the second baffle are configured to constrict and expand the melt as the melt flows from the pump to the freezing area.

14. The sheet production apparatus of claim 13, wherein the pump is incorporated into a flow divider positioned horizontally within the vessel.

15. The sheet production apparatus of claim 14, wherein the return is positioned below the flow divider.

16. The apparatus of claim 13, further comprising a gas jet disposed adjacent to said freezing area, said gas jet configured to stabilize a meniscus between said sheet and said melt.

17. The apparatus of claim 13, wherein a portion of the first baffle is disposed above the melt.

* * * * *